(12) United States Patent
Tsai et al.

(10) Patent No.: US 10,748,843 B2
(45) Date of Patent: Aug. 18, 2020

(54) SEMICONDUCTOR SUBSTRATE INCLUDING EMBEDDED COMPONENT AND METHOD OF MANUFACTURING THE SAME

(71) Applicant: Advanced Semiconductor Engineering, Inc., Kaohsiung (TW)

(72) Inventors: Li Chuan Tsai, Kaohsiung (TW); Po-Shu Peng, Kaohsiung (TW); Cheng-Lin Ho, Kaohsiung (TW); Chih Cheng Lee, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 142 days.

(21) Appl. No.: 15/356,407

(22) Filed: Nov. 18, 2016

(65) Prior Publication Data
US 2018/0145017 A1 May 24, 2018

(51) Int. Cl.
*H05K 1/18* (2006.01)
*H01L 23/498* (2006.01)
*H05K 3/46* (2006.01)
*H01L 21/48* (2006.01)

(52) U.S. Cl.
CPC ...... *H01L 23/49838* (2013.01); *H01L 21/486* (2013.01); *H01L 21/4853* (2013.01); *H01L 21/4857* (2013.01); *H01L 23/49822* (2013.01); *H01L 23/49894* (2013.01); *H05K 1/186* (2013.01); *H05K 3/4682* (2013.01); *H05K 3/4697* (2013.01); *H01L 23/49827* (2013.01); *H01L 2224/16225* (2013.01); *H01L 2924/15311* (2013.01); *H01L 2924/181* (2013.01); *H05K 2201/096* (2013.01)

(58) Field of Classification Search
USPC .................................... 361/767, 760, 761
See application file for complete search history.

(56) References Cited

U.S. PATENT DOCUMENTS

| 2012/0024583 A1* | 2/2012 | Lee ........................ H05K 1/186 174/260 |
| 2013/0182401 A1* | 7/2013 | Furutani .............. H05K 1/0296 361/782 |
| 2016/0143149 A1 | 5/2016 | Su et al. |
| 2016/0150651 A1 | 5/2016 | Tsai et al. |

* cited by examiner

*Primary Examiner* — Andargie M Aychillhum
(74) *Attorney, Agent, or Firm* — Foley & Lardner LLP

(57) ABSTRACT

A semiconductor substrate includes a multi-layered structure, a component and a first conductive via. The multi-layered structure includes a plurality of dielectric layers and a plurality of patterned conductive layers. A topmost patterned conductive layer of the patterned conductive layers is embedded in a topmost dielectric layer of the dielectric layers. The component is embedded in the multi-layered structure. The first conductive via is electrically connected to the component and one of the patterned conductive layers. At least one of the patterned conductive layers is located at a depth spanning between a top surface of the passive layer and a bottom surface of the component

20 Claims, 13 Drawing Sheets

SEMICONDUCTOR SUBSTRATE INCLUDING EMBEDDED COMPONENT AND METHOD OF MANUFACTURING THE SAME

BACKGROUND

1. Technical Field

The present disclosure relates to a semiconductor substrate and a method of manufacturing the same, and more particularly, to a semiconductor substrate including an embedded component and a method of manufacturing the same.

2. Description of the Related Art

Semiconductor devices have become progressively more complex, driven at least in part by a demand for smaller sizes and enhanced processing speeds. At the same time, there is a demand to further minimize sizes of many electronic products containing these semiconductor devices. Semiconductor devices are typically packaged, and then may be installed on a substrate that includes electrical circuitry, such as a circuit board. This results in space being occupied by both the semiconductor device package and the substrate, with a surface area on the substrate being occupied by the semiconductor device package. In addition, costs may be incurred by performing packaging, board manufacturing, and assembly as separate processes. It would be desirable to reduce the space occupied by the semiconductor device on the substrate, to simplify and combine the packaging, board manufacturing, and assembly processes as applied to the semiconductor device and the substrate, and to include more circuit layers in the same substrate.

SUMMARY

In some embodiments, a semiconductor substrate includes a multi-layered structure, a component and a first conductive via. The multi-layered structure includes a plurality of dielectric layers and a plurality of patterned conductive layers. A topmost patterned conductive layer of the patterned conductive layers is embedded in a topmost dielectric layer of the dielectric layers. The component is embedded in the multi-layered structure. The first conductive via is electrically connected to the component and one of the patterned conductive layers. At least one of the patterned conductive layers is located at a depth spanning between a top surface and a bottom surface of the component.

In some embodiments, a semiconductor substrate includes a first dielectric structure, a component, a second dielectric structure and a conductive via. The first dielectric structure including a first surface and a second surface and a plurality of patterned conductive layers. A topmost patterned conductive layer of the patterned conductive layers is embedded in the first surface of the first dielectric structure. The component is embedded in the first dielectric structure and exposed from the second surface of the first dielectric structure. The component has a thickness greater than a distance between the second surface of the first dielectric structure and one of the patterned conductive layers of the first dielectric structure. The second dielectric structure is attached to the second surface of the first dielectric structure and covers the component. The conductive via is electrically connected to the component and one of the patterned conductive layers.

In some embodiments, a method of manufacturing a semiconductor substrate includes: providing a multi-layered structure including a plurality of patterned conductive layers and a cavity; providing a first dielectric structure including a component disposed on a first surface of the first dielectric structure; aligning the component with the cavity of the multi-layered structure; laminating the multi-layered structure and the first dielectric structure to encapsulate the component; and electrically connecting the component to one of the patterned conductive layers.

BRIEF DESCRIPTION OF THE DRAWINGS

FIG. 8(k) and FIG. 8(l) illustrate a method of forming a cavity in a multi-layered structure according to some embodiments of the present disclosure.

Figure 1:
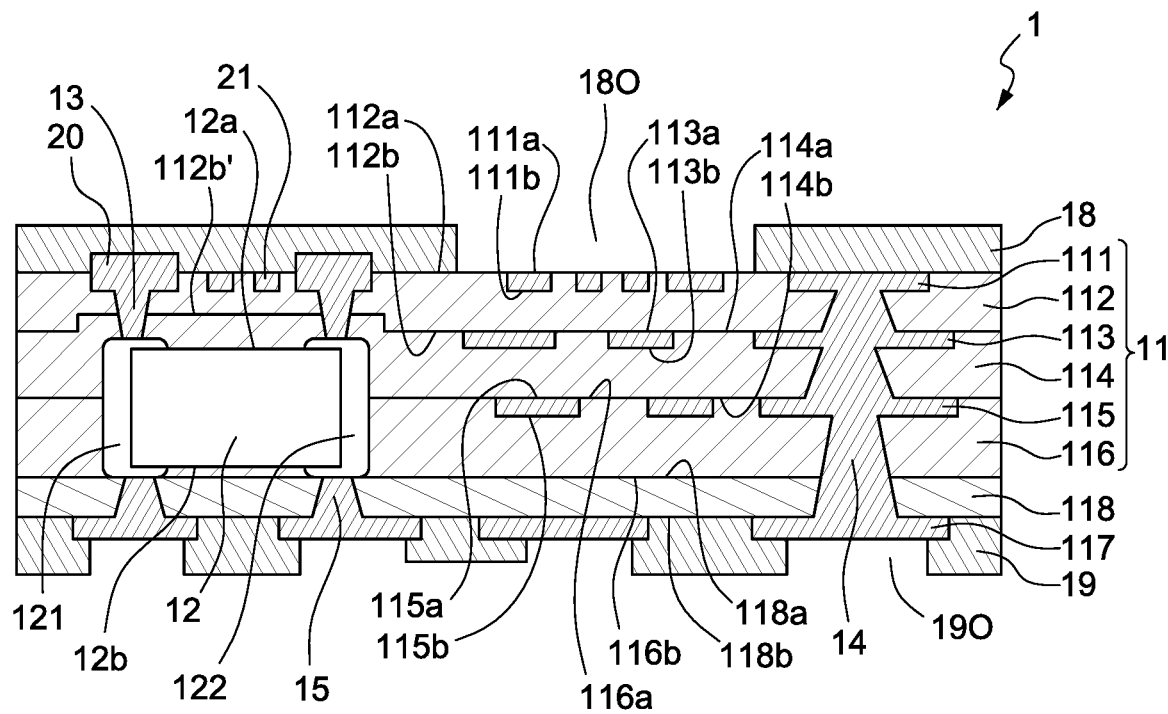
FIG. 1 illustrates a cross-sectional view of a semiconductor substrate in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

Various substrates including embedded semiconductor devices, for example, chip-embedded substrates, have been proposed, wherein a semiconductor device is first embedded or disposed in a substrate and then a rerouting structure is fabricated in subsequent processes. The rerouting structure may include a redistribution layer (RDL) and interconnectors (e.g., conducting posts) extending from the RDL and terminating at contact structures at a surface of a thick support layer, to accommodate a next level packaging structure. The RDL may be supported by a passivation layer formed over the embedded semiconductor device. A polymeric layer may be deposited over the RDL and etched or drilled to provide a via for over-filling using a metal to form an interconnector (e.g., a conducting post) that extends above and beyond an opening of the via. It is desirable to include more RDLs in a substrate having a same size.

Described herein is a semiconductor substrate and a method of manufacturing the same in which high-resolution techniques may be used to fulfill the above purpose. The present disclosure describes techniques suitable for a manufacture of smaller semiconductor device packages allowing more flexibility for pattern design, low warpage and low aspect ratio of blind vias As used herein, each of the terms "upper", "lower", "top", "bottom," "side" and "lateral" refer to the illustrated context in the corresponding figure associated with the description using the term. For example, a "top surface" indicates the top of the respective component in the orientation illustrated in the corresponding figure.

Although the present disclosure will be described below with reference to a semiconductor substrate including four patterned conductive layers illustrated in the drawings, it should be noted that some embodiments of the semiconductor substrate according to the present disclosure can be used to build up more patterned conductive layers or such substrate can be obtained by including more patterned conductive layers in a multi-layered structure.

FIG. 1 illustrates a cross-sectional view of a semiconductor substrate 1 in accordance with some embodiments of the present disclosure. The semiconductor substrate 1 includes a multi-layered structure 11, a component 12 and a first conductive via 13.

The multi-layered structure 11 includes a plurality of dielectric layers and a plurality of patterned conductive layers. In some embodiments, the multi-layered structure 11 includes three dielectric layers (e.g., dielectric layers 112, 114, 116) and three patterned conductive layers (e.g., conductive layers 111, 113, 115). In some embodiments, the multi-layered structure 11 may include more than three dielectric layers (for example, four, five or six dielectric layers) and more than three patterned conductive layers (for example, four, five or six conductive layers).

In some embodiments, for example, as shown in FIG. 1, the substrate 1 includes three dielectric layers and three patterned conductive layers. In some embodiments, the multi-layered structure 11 includes a first dielectric layer 112, a first patterned conductive layer 111, a second dielectric layer 114, a second patterned conductive layer 113, a third dielectric layer 116 and a third patterned conductive layer 115. The first dielectric layer 112 includes a first surface 112a and an opposing second surface 112b. The first patterned conductive layer 111 is embedded at the first surface 112a of the first dielectric layer 112. For example, the first patterned conductive layer 111 does not protrude from the first surface 112a of the first dielectric layer 112. The second dielectric layer 114 includes a first surface 114a and an opposing second surface 114b and the first surface 114a of the second dielectric layer 114 is coupled (e.g., attached) to the second surface 112b of the first dielectric layer 112. The second patterned conductive layer 113 is formed at the second surface 112b of the first dielectric layer 112. The third dielectric layer 116 includes a first surface 116a and an opposing second surface 116b, and the first surface 116a of the third dielectric layer 116 is coupled (e.g., attached) to the second surface 114b of the second dielectric layer 114. The third patterned conductive layer 115 is formed at the second surface 114b of the second dielectric layer 114.

An outermost or topmost patterned conductive layer (e.g., the first patterned conductive layer 111) of the patterned conductive layers 111, 113, 115 is embedded in an outermost or topmost dielectric layer (e.g., the first dielectric layer 112) of the dielectric layers 112, 114, 116. The first patterned conductive layer 111 may be, but is not limited to, an RDL including traces 21 and contact pads. Because the first patterned conductive layer 111 is embedded in the first dielectric layer 112, a minimum line width of approximately 20 micrometers (μm) or less and a minimum line-to-line space (e.g., pitch) of approximately 20 μm or less may be achieved.

The component 12 is embedded in the multi-layered structure 11. The component 12 is an electronic component which may be, for example, a passive component (e.g., a capacitor, a resistor or an inductor), an active component or a small package. The component 12 includes two electrical contacts 121 and 122. In some embodiments, each of the electrical contacts 121 and 122 is disposed along a side surface of the component 12 and has a length substantially identical to that of the side surface of the component 12. In some embodiments (e.g., as shown in FIG. 1), each of the electrical contacts 121 and 122 is disposed along a side surface of the component 12 and extends and covers a portion of a top surface 12a of the component 12 and a portion of a bottom surface 12b of the component 12. The bottom surface 12b of the component 12 (or a lower surface of each of the electrical contacts 121 and 122 in some embodiments, for example, where the electrical contacts 121 and 122 extend and cover a portion of the bottom surface 12b of the component 12) is exposed from the second surface 116b of the third dielectric layer 116 of the multi-layered structure 11.

In some embodiments of the present disclosure, at least one of the patterned conductive layers is located at (or is aligned with or corresponding to) a depth or length spanning between the top surface 12a and the bottom surface 12b of the component 12. For example, the third patterned conductive layer 115 is aligned within a depth or length spanning between the top surface 12a and the bottom surface 12b of the component 12 such that a thickness of the substrate 1 can be reduced.

The first conductive via 13 is electrically connected to the component 12 and one of the patterned conductive layers. The electrical connection between the first conductive via 13 and the component 12 can be implemented, for example, by contacting the first conductive via 13 to an upper surface of the electrical contact 121 or 122 of the component 12. In some embodiments, the first conductive via 13 is electrically connected to the outermost patterned conductive layer (e.g., the first patterned conductive layer 111) and passes through at least two of the dielectric layers (e.g., the first and second dielectric layers 112, 114) of the multi-layered structure 11.

The patterned conductive layer located above the component 12 may include a portion passing over the top surface of the component. For example, as shown in FIG. 1, a portion (e.g., traces 21) of the outermost patterned conductive layer 111 passes or extends over the top surface of the component 12 and is electrically isolated from the component. In some embodiments of the present disclosure, since a portion of a patterned conductive layer passes over a top surface of the component, more surface area for routing is provided and thus increases in flexibility of circuit design may be realized.

According to some embodiments of the present disclosure, because a component may be embedded or encapsulated by more than one dielectric layer, a size of a semiconductor substrate can be reduced as compared to comparable semiconductor substrates, and therefore, it may be beneficial to include more RDL layers in a semiconductor substrate having a relatively small size.

In some embodiments, the second surface 112b of the first dielectric layer 112 may include a recess 112b' and the component 12 may be disposed under the recess. A space defined by the recess 112b' may be filled with a protrusion of the second dielectric layer 114 and the component 12 under the recess 112b' may pass through the second and third dielectric layers 114 and 116. In some embodiments, the recess 112b' contacts (e.g., directly contacts) the component 12. For example, the component 12 passes through the second and third dielectric layers 114 and 116 and a portion of the first dielectric layer 112. Because of implementation of the recess 112b', the size of the semiconductor substrate 1 can be further reduced.

The semiconductor substrate 1 may further include a fourth dielectric layer 118 and a fourth patterned conductive layer 117. The fourth dielectric layer 118 includes a first surface 118a and an opposing second surface 118b. The first surface 118a of the fourth dielectric layer 118 is attached or coupled to the second surface 116b of the third dielectric layer 116 of the multi-layered structure 11 and may contact (e.g., directly contact) the bottom surface 12b of the component 12 (or the lower surfaces of the electrical contacts 121 and 122). The fourth patterned conductive layer 117 is disposed on the second surface 118b of the fourth dielectric layer 118.

The semiconductor substrate 1 may further include a second conductive via 14 electrically connected to the fourth patterned conductive layer 117 and one of the first, second and third patterned conductive layers 111, 113, and 115 of the multi-layered structure 11. The second conductive via 14 passes through at least two of the dielectric layers (e.g., the third dielectric layer 116 and the fourth dielectric layer 118). In some embodiments, the second conductive via 14 is electrically connected to the fourth patterned conductive layer 117 and the third patterned conductive layer 115 and passes through the third dielectric layer 116 and the fourth dielectric layer 118.

The semiconductor substrate 1 may further include a first solder resist layer 18 disposed on the first surface 112a of the first dielectric layer 112 and a second solder resist layer 19 disposed on the second surface 118b of the fourth dielectric layer 118. The first solder resist layer 18 includes a plurality of openings 18O to expose portions of the first patterned conductive layer 111 for contacting another device, such as a flip-chip-mounted semiconductor die. A top of the semiconductor substrate 1 may thus be referred to as "chip side." The second solder resist layer 19 includes a plurality of openings 19O to expose portions of the fourth patterned conductive layer 117 and the second conductive via 14 such that the semiconductor substrate 1 can contact another device, such as a printed circuit board. A bottom of the semiconductor substrate 1 may thus be referred to as "ball side."

The semiconductor substrate 1 may further include a third conductive via 15 electrically connected to the component 12 and exposed from the openings 19O of the second solder resist layer 19. Therefore, a double-sided interconnection can be formed such that the component 12 can be electrically connected to an external device on the chip side and to another external device on the ball side.

The first dielectric layer 112, second dielectric layer 114 and third dielectric layer 116 of the multi-layered structure 11 may be made from a same material. In other embodiments, two or more of the first dielectric layer 112, second dielectric layer 114 and third dielectric layer 116 may be made from different materials. In some embodiments, the first dielectric layer 112, second dielectric layer 114 and third dielectric layer 116 of the multi-layered structure 11 are made from a pre-impregnated composite material (e.g., pre-preg) layer, for example, which is a dielectric resin material including glass fibers therein. Examples of a pre-preg (PP) layer may include, but are not limited to, a single-layer structure of a pre-impregnated material and/or sheet and a multi-layer structure formed by stacking or laminating a number of pre-impregnated materials and/or sheets.

The first patterned conductive layer 111, second patterned conductive layer 113, third patterned conductive layer 115 and fourth patterned conductive layer 117 may be made from a same material, or two or more of the first patterned conductive layer 111, second patterned conductive layer 113, third patterned conductive layer 115 and fourth patterned conductive layer 117 may be made from different materials. The material of the first patterned conductive layer 111, second patterned conductive layer 113, third patterned conductive layer 115 and fourth patterned conductive layer 117 may include copper (Cu) or another metal or alloy.

In some embodiments, the fourth dielectric layer 118 and the third dielectric layer 116 are made from different materials. The fourth dielectric layer 118 may be made from a dielectric material which includes no glass fibers, e.g., an adhesive resin which includes no glass fibers. In some embodiments, the third dielectric layer 116 is made from a dielectric material including glass fibers and the fourth dielectric is made from a dielectric material including no glass fibers.

In some embodiments, the fourth dielectric layer 118 is made from an adhesive resin (e.g., and adhesive resin including no glass fibers).

In some embodiments of the present disclosure, since a circuit structure may be built on both sides of the component 12, warpage may be reduced.

Figure 2:
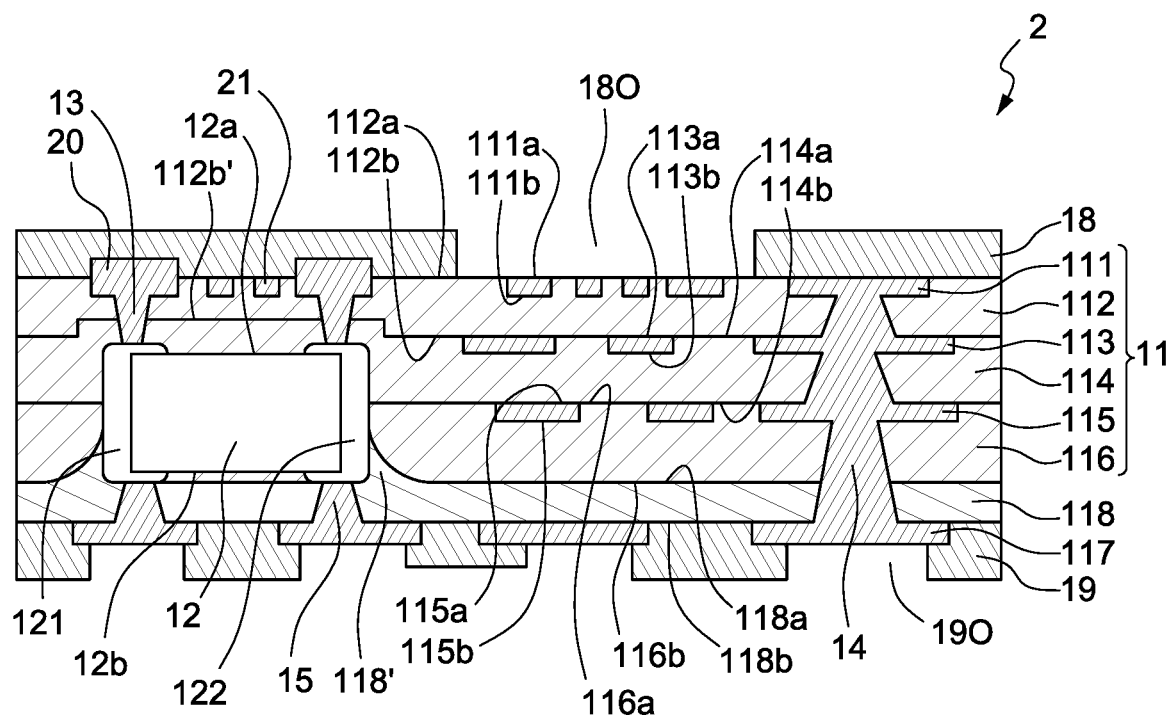
FIG. 2 illustrates a cross-sectional view of a semiconductor substrate in accordance with some embodiments of the present disclosure.

FIG. 2 illustrates a cross-sectional view of a semiconductor substrate 2 in accordance with some embodiments of the present disclosure. The semiconductor substrate 2 may be similar to the semiconductor substrate 1 as described and illustrated with reference to FIG. 1 except that the fourth dielectric layer 118 includes a portion 118' extending towards a lateral surface of the component 12.

Figure 3:
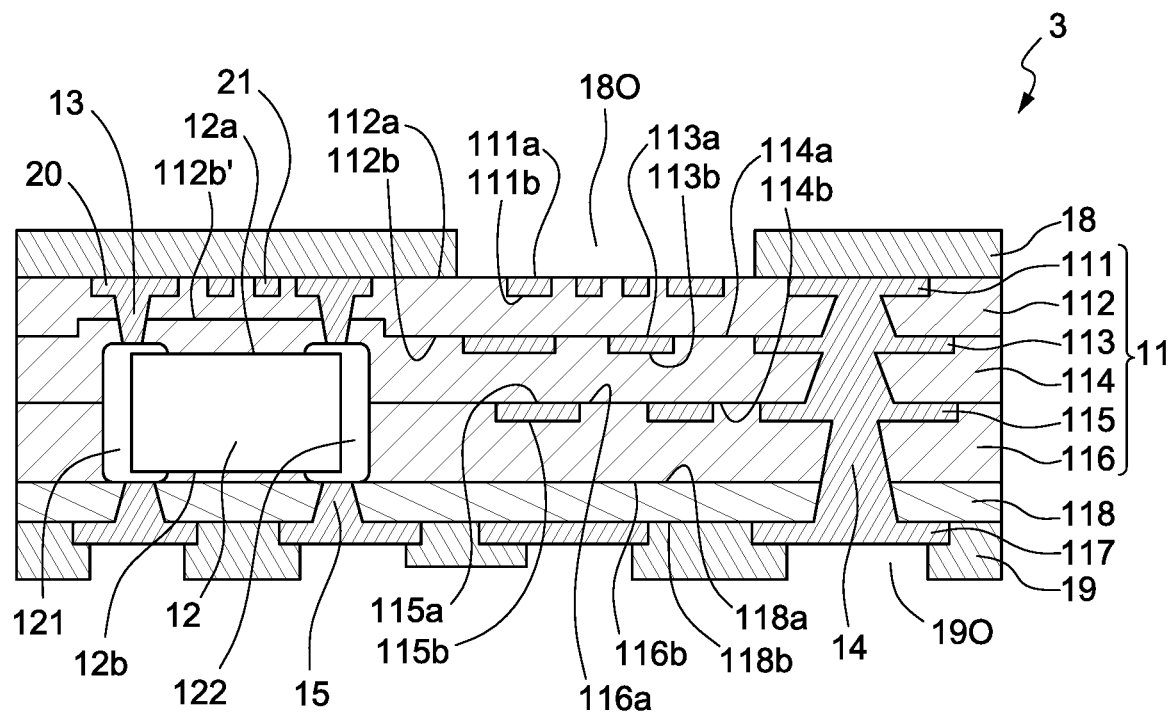
FIG. 3 illustrates a cross-sectional view of a semiconductor substrate in accordance with some embodiments of the present disclosure.

FIG. 3 illustrates a cross-sectional view of a semiconductor substrate 3 in accordance with some embodiments of the present disclosure. The semiconductor substrate 3 may be similar to the semiconductor substrate 1 as described and illustrated with reference to FIG. 1. In some embodiments (e.g., as shown in FIG. 1), the traces 21 of the first patterned conductive layer 111 are embedded in the first dielectric layer 112, but the contact pads 20 of the first conductive vias 13 protrude from the first surface 112a of the first dielectric layer 112. However, in other embodiments, (e.g., as shown in FIG. 3), the traces 21 and contact pads 20 of the first conductive vias 13 are embedded in the first dielectric layer 112. An etching process can be applied to flatten the protruded contact pads 20 (e.g., as shown in FIG. 1) and form the semiconductor substrate 3 (e.g., as shown in FIG. 3).

Figure 4:
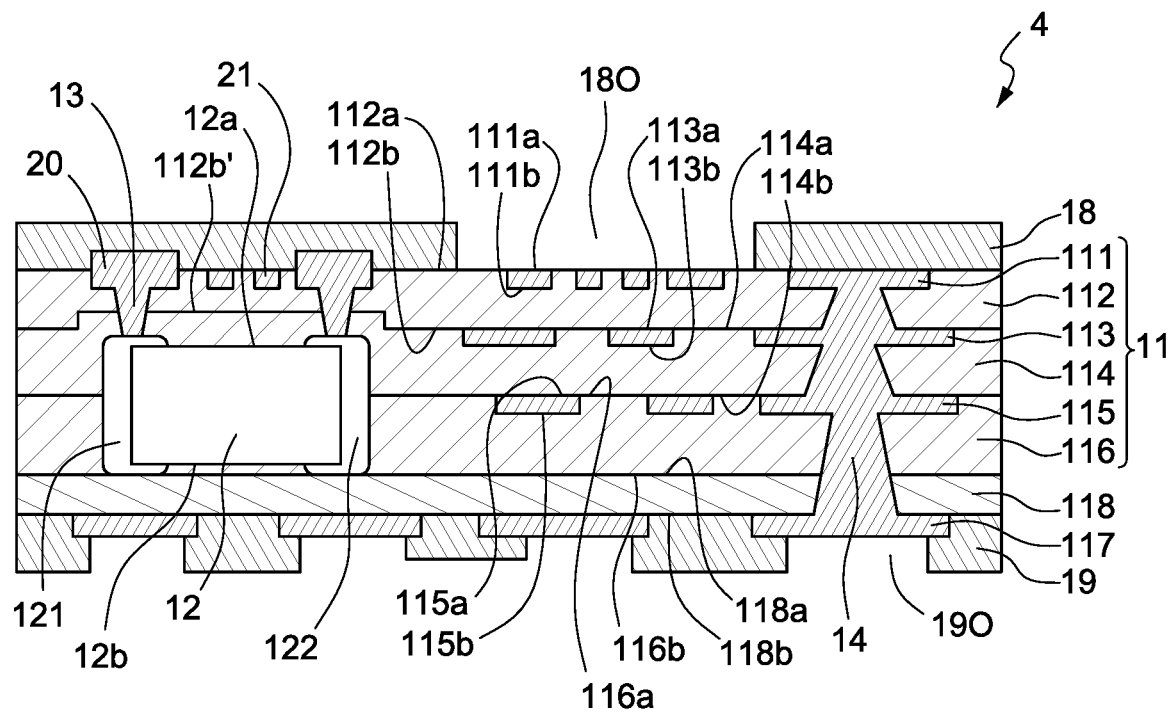
FIG. 4 illustrates a cross-sectional view of a semiconductor substrate in accordance with some embodiments of the present disclosure.

FIG. 4 illustrates a cross-sectional view of a semiconductor substrate 4 in accordance with some embodiments of the present disclosure. The semiconductor substrate 4 may be similar to the semiconductor substrate 1 as described and illustrated with reference to FIG. 1 except that the semiconductor substrate 4 does not include the third conductive via 15 (e.g., the semiconductor substrate 4 provides single-side interconnection at the chip side, but not at the ball side).

Figure 5:
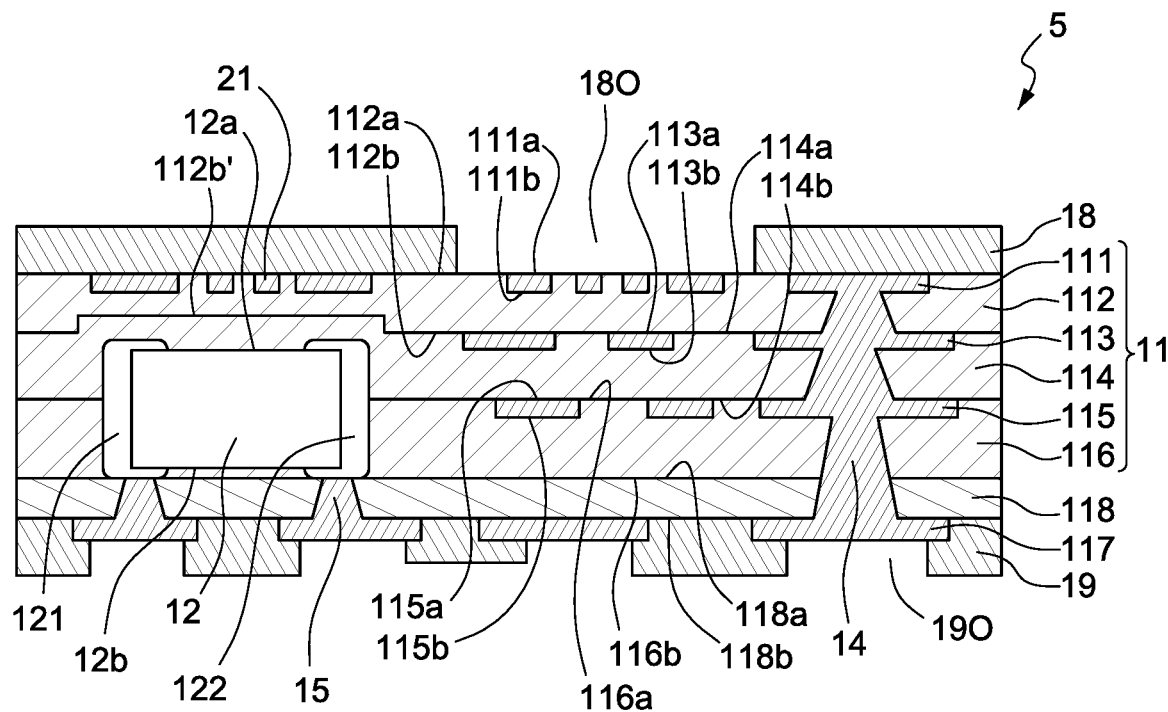
FIG. 5 illustrates a cross-sectional view of a semiconductor substrate in accordance with some embodiments of the present disclosure.

FIG. 5 illustrates a cross-sectional view of a semiconductor substrate 5 in accordance with some embodiments of the present disclosure. The semiconductor substrate 5 may be similar to the semiconductor substrate 1 as described and illustrated with reference to FIG. 1 except that the semiconductor substrate 5 does not include a second conductive via 13 (e.g., the semiconductor substrate 5 provides single-side interconnection at the ball side, but not at the chip side).

Figure 6:
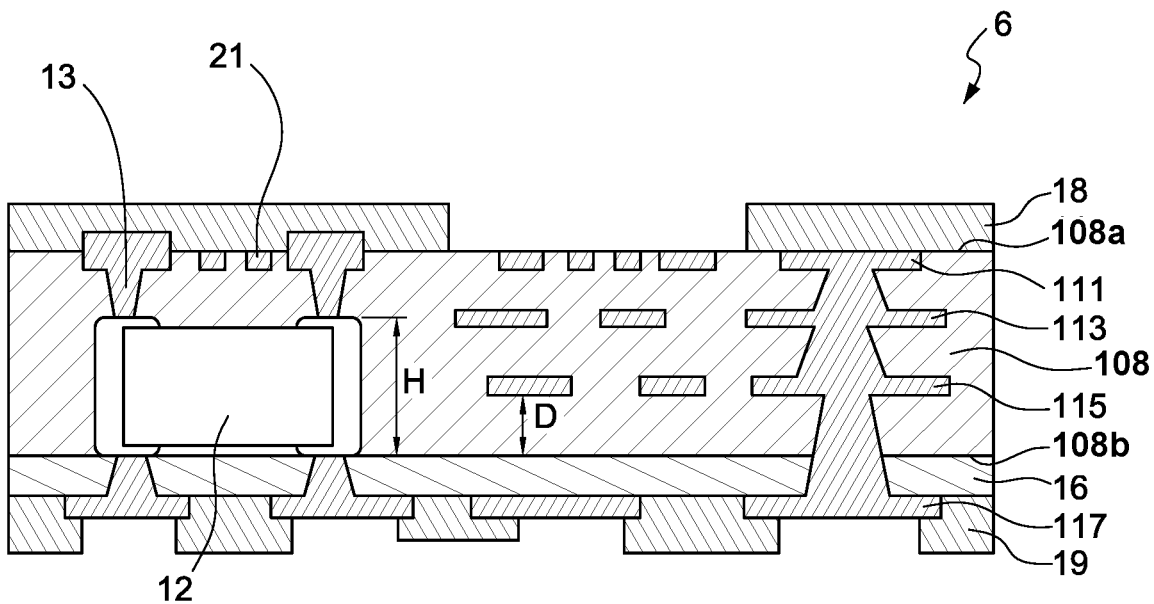
FIG. 6 illustrates a cross-sectional view of a semiconductor substrate in accordance with some embodiments of the present disclosure.

FIG. 6 illustrates a cross-sectional view of a semiconductor substrate 6 in accordance with some embodiments of the present disclosure. The semiconductor substrate 6 includes a first dielectric structure 108, the component 12, a second dielectric structure 16, and the conductive via 13. The first dielectric structure 108 includes a first surface 108a and an opposing second surface 108b and the plurality of patterned conductive layers 111, 113 and 115. The outermost or topmost patterned conductive layer 111 of the patterned conductive layers 111, 113, 115 is embedded in the first surface 108a of the first dielectric structure 108. The component 12 is embedded in the first dielectric structure 108 and exposed from the second surface 108b of the first dielectric structure 108. The second dielectric structure 16 is attached or coupled to the second surface 108b of the first dielectric structure 108 and covers the component 12. The conductive via 13 is electrically connected to the component 12 and one of the patterned conductive layers (e.g., conductive layer 111). The component 12 has a thickness H greater than the distance D between the second surface 108b of the first dielectric structure 108 and one of the patterned conductive layers 111, 113, 115 of the first dielectric structure 108. The embodiments of the component 12 are as disclosed above.

In some embodiments, the first dielectric structure 108 and the second dielectric structure 16 are made from different materials. The first dielectric structure 108 is made from a pre-impregnated composite material (e.g., PP) layer, which is, for example, a dielectric resin material including glass fibers therein. The second dielectric structure 16 may be made from a dielectric material which includes no glass fibers (e.g., an adhesive resin which includes no glass fibers).

As described above, the patterned conductive layers 111, 113 and 115 may be made from the same material, or two or more of the patterned conductive layers 111, 113 and 115 may be made from different materials. The material of one or more of the patterned conductive layers 111, 113 and 115 may include Cu or another metal or alloy.

In some embodiments, the second dielectric structure 16 is made from an adhesive resin and includes a portion extending towards a lateral surface of the component 12.

Figure 7:
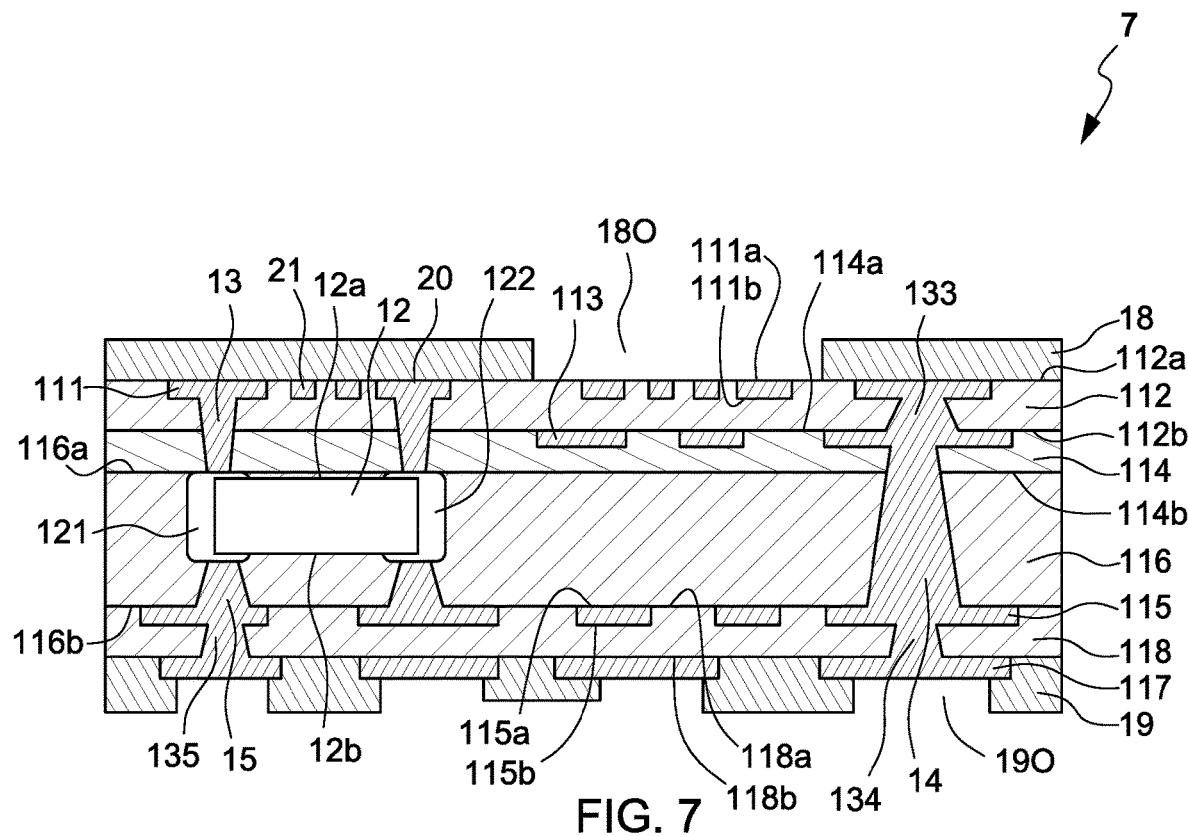
FIG. 7 illustrates a cross-sectional view of a semiconductor substrate in accordance with some embodiments of the present disclosure.

FIG. 7 illustrates a cross-sectional view of a semiconductor substrate 7 in accordance with some embodiments of the present disclosure.

The semiconductor substrate 7 includes a multi-layer structure including the first dielectric layer 112, the first patterned conductive layer 111, the second dielectric layer 114, the second patterned conductive layer 113, the third dielectric layer 116 and the third patterned conductive layer 115. The first dielectric layer 112 includes the first surface 112a and the opposing second surface 112b. The first patterned conductive layer 111 is embedded at the first surface 112a of the first dielectric layer 112. The second dielectric layer 114 includes the first surface 114a and the opposing second surface 114b and the first surface 114a of the second dielectric layer 114 is attached or coupled to the second surface 112b of the first dielectric layer 112. The second patterned conductive layer 113 is formed at the second surface 112b of the first dielectric layer 112. The third dielectric layer 116 includes the first surface 116a and the opposing second surface 116b, and the first surface 116a of the third dielectric layer 116 is attached or coupled to the second surface 114b of the second dielectric layer 114. The third patterned conductive layer 115 is disposed at the second surface 116b of the third dielectric layer 116.

An outermost or topmost patterned conductive layer (e.g., the first patterned conductive layer 111) of the patterned conductive layers 111, 113, and 115 is embedded in an outermost or topmost dielectric layer (e.g., the first dielectric layer 112) of the dielectric layers 112, 114, and 116. The first patterned conductive layer 111 may be, but is not limited to, an RDL including traces 21 and contact pads. Because the first patterned conductive layer 111 is embedded in the first dielectric layer 112, a minimum line width of approximately 20 µm or less and a minimum line-to-line space (or pitch) of approximately 20 µm or less may be achieved.

The component 12 is embedded in the multi-layered structure. The component 12 is an electronic component which may be, for example, a passive component (e.g., a capacitor, a resistor or an inductor), an active component or a small package. The component 12 includes the two electrical contacts 121 and 122. In some embodiments, each of the electrical contacts 121 and 122 is disposed along a side surface of the component 12 and has a length substantially identical to that of the side surface of the component 12. In some embodiments (e.g., as shown in FIG. 7), each of the electrical contacts 121 and 122 is disposed along a side surface of the component 12 and extends and covers a portion of the top surface 12a of the component 12 and the portion of the bottom surface 12b of the component 12. The top surface 12a of the component 12 (or the upper surface of electrical contacts 121 and 122) is exposed from the first surface 116a of the third dielectric layer 116 of the multi-layered structure.

The first conductive via 13 is electrically connected to the component 12 and one of the patterned conductive layers 111, 113, 115. The electrical connection between the first conductive via 13 and the component 12 can be implemented, for example, by contacting the first conductive via 13 to the upper surface of the electrical contact 121 or 121 of the component 12. In some embodiments, the first conductive via 13 is electrically connected to the outermost or topmost patterned conductive layer (e.g., the first patterned conductive layer 111) and passes through at least two of the dielectric layers (e.g., the first and second dielectric layers 112, 114) of the multi-layered structure.

The patterned conductive layer located above the component 12 may include a portion that passes over the top surface 12a of the component 12. For example (e.g., as shown in FIG. 7), a portion (e.g., traces 21) of the outermost or topmost patterned conductive layer 111 passes over the top surface 12a of the component 12 and is electrically isolated from the component 12. In some embodiments of the present disclosure, since a portion of a patterned conductive layer passes over a top surface of a component, more surface area for routing is provided, and thus flexibility of circuit design is increased.

The semiconductor substrate 7 may further include the fourth dielectric layer 118 and the fourth patterned conductive layer 117. The fourth dielectric layer 118 includes the first surface 118a and the opposing second surface 118b. The first surface 118a of the fourth dielectric layer 118 is attached or coupled to the second surface 116b of the third dielectric layer 116 of the multi-layered structure. The fourth patterned conductive layer 117 is disposed on the second surface 118b of the fourth dielectric layer 118.

The semiconductor substrate 7 may further include the second conductive via 14 electrically connected to the third patterned conductive layer 115 and the second patterned conductive layer 113 of the multi-layered structure. The second conductive via 14 passes through at least two of the dielectric layers (e.g., the second dielectric layer 114 and the third dielectric layer 116). In some embodiments (e.g., as shown in FIG. 7), the second conductive via 14 is electrically connected to the third patterned conductive layer 115 and the second patterned conductive layer 113 and passes through the second dielectric layer 114 and the third dielectric layer 116.

The semiconductor substrate 7 may further include the third conductive via 15 electrically connected to the component 12 at an opposing side of the component 12 corresponding to the first conductive via 13. Therefore, a double-sided interconnection can be formed such that the component 12 can be electrically connected to an external device on the chip side and to another external device on the ball side.

The semiconductor substrate 7 may further include conductive vias 133, 134 and 135. The conductive via 133 is electrically connected to the first patterned conductive layer 111 and the second patterned conductive layer 113. The conductive via 134 is electrically connected to the third patterned conductive layer 115 and the fourth patterned conductive layer 117. The conductive via 135 is electrically connected to the third conductive via 15 and is exposed from the second surface 118b of the fourth dielectric layer 118.

The semiconductor substrate 7 may further include the first solder resist layer 18 disposed on the first surface 112a of the first dielectric layer 112 and the second solder resist layer 19 disposed on the second surface 118b of the fourth dielectric layer 118. The first solder resist layer 18 includes the plurality of openings 18O to expose portions of the first patterned conductive layer 111 for contacting another device, such as a flip-chip-mounted semiconductor die. The second solder resist layer 19 includes the plurality of openings 19O to expose portions of the fourth patterned conductive layer 117 or the conductive vias 134 or 135 such that the semiconductor substrate 7 can contact another device, such as a printed circuit board.

The first dielectric layer 112, third dielectric layer 116 and fourth dielectric layer 118 may be made from a same material, or two or more may be made from different materials. In some embodiments, the first dielectric layer 112, third dielectric layer 116 and fourth dielectric layer 118 are made from a molding compound or a pre-impregnated composite material (e.g., PP) layer, which is, for example, a dielectric resin material including glass fibers therein. Examples of a PP layer may include, but are not limited to, a single-layer structure of a pre-impregnated material and/or sheet and a multi-layer structure formed by stacking or laminating a number of pre-impregnated materials and/or sheets.

The first patterned conductive layer 111, second patterned conductive layer 113, third patterned conductive layer 115 and fourth patterned conductive layer 117 may be made from a same material, or two or more may be made from different materials, and the material may include Cu or another metal or alloy.

In some embodiments, the second dielectric layer 114 is made from a material different from those of the first dielectric layer 112, third dielectric layer 116 and fourth dielectric layer 118. The fourth dielectric layer 114 may be made from a dielectric material which includes no glass fibers (e.g., an adhesive resin which includes no glass fibers).

FIG. 8(a), FIG. 8(b), FIG. 8(c), FIG. 8(d), FIG. 8(e), FIG. 8(f), FIG. 8(g), FIG. 8(h), FIG. 8(i), and FIG. 8(j) illustrate a method for manufacturing the semiconductor substrate 1 in accordance with some embodiments of the present disclosure.

FIG. 8(a), FIG. 8(b), FIGS. 8(c) and 8(d) illustrate a process for providing a multi-layered structure 81 including a plurality of patterned conductive layers and a cavity 10 according to some embodiments of the present disclosure.

Figure 8A:
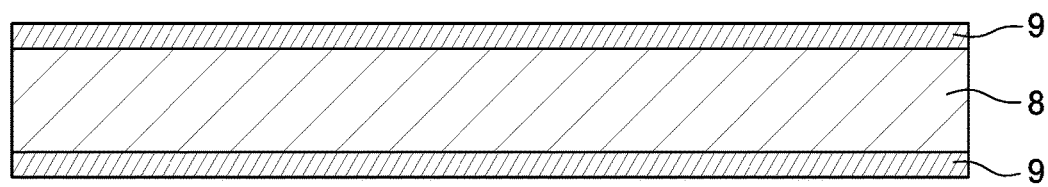
FIG. 8(a), FIG. 8(b), FIG. 8(c), FIG. 8(d), FIG. 8(e), FIG. 8(f), FIG. 8(g), FIG. 8(h), FIG. 8(i), and FIG. 8(j) illustrate a method for manufacturing a semiconductor substrate in accordance with some embodiments of the present disclosure.

Referring to FIG. 8(a), a first carrier 8 including a metal layer 9 on each of two opposing surfaces of the first carrier 8 is provided. The first carrier 8 may be, for example, a silicon substrate, a plastic substrate, or a metal panel. The first carrier 8 may facilitate the subsequent process thereon. The metal layer 9 may include a thin sheet. The metal layer 9 may include, for example, a copper sheet or copper foil, or other conductive material.

Although in the following drawings, a single-side manufacturing method is illustrated, it should be noted that according to some embodiments of the present disclosure, a double-sided manufacturing method can be carried out in a similar manner.

Figure 8B:
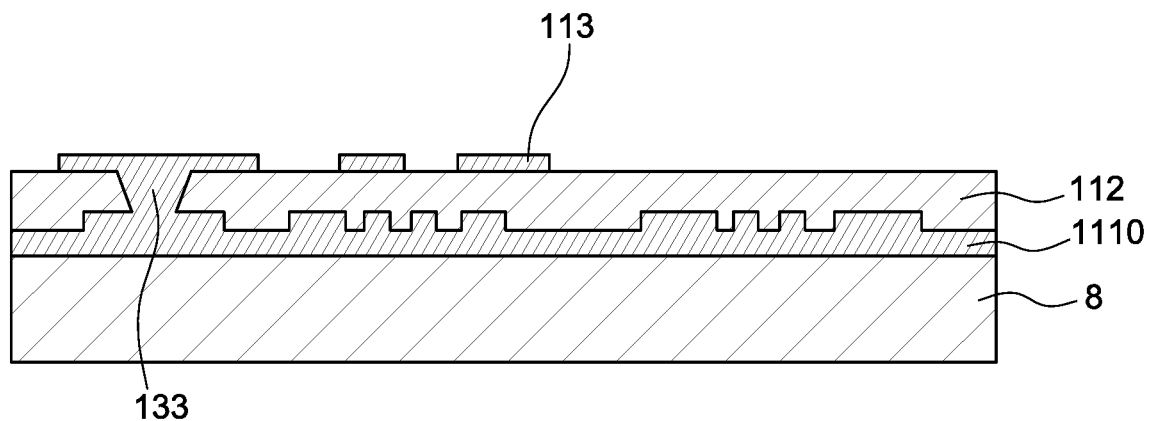

Referring to FIG. 8(b), a first patterned conductive layer 1110 is formed on the metal layer 9, for example, using photo-lithography and plating technology. A first dielectric layer 112 is formed on the first patterned conductive layer 1110 to embed or cover the first patterned conductive layer 1110. A conductive via 133 is formed on the first patterned conductive layer 1110 and passes through the first dielectric layer 112. A second patterned conductive layer 113 is formed on the first dielectric layer 112 and is electrically connected to the conductive via 133.

Figure 8C:
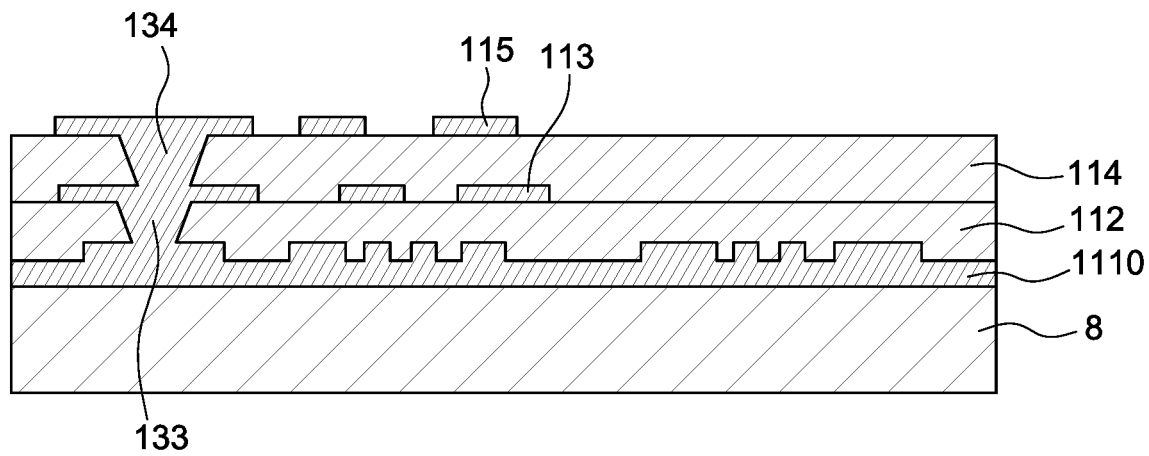

Referring to FIG. 8(c), a second dielectric layer 114 is formed on the second patterned conductive layer 113 to embed or cover the second patterned conductive layer 113. A conductive via 134 is formed on the second patterned conductive layer 113 and passes through the second dielectric layer 114. A third patterned conductive layer 115 is formed on the second dielectric layer 114 and is electrically connected to the conductive via 134.

The conductive vias 133 and 134, the second patterned conductive layer 113 and the third patterned conductive layer 115 (e.g., illustrated in FIGS. 8(b) and 8(c)) may be formed by any suitable technique. For example, the conductive via 133 and the second patterned conductive layer 113 may be produced by forming a via hole using etching, laser drilling or other suitable technique and then forming the conductive via 133 and the second patterned conductive layer 113 using photo-lithography and plating technology. The conductive via 134 and the third patterned conductive layer 115 can be produced in a similar manner. The first dielectric layer 112 and the second dielectric layer 114 may be formed by laminating a PP layer to the first patterned conductive layer 1110 and the second patterned conductive layer 113, respectively.

Figure 8D:
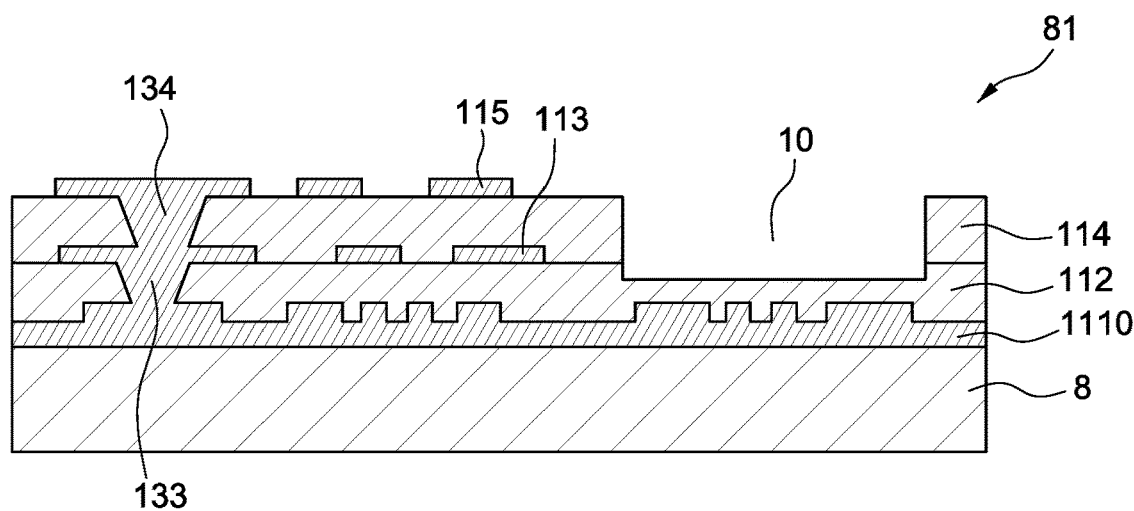

Referring to FIG. 8(d), the cavity 10 is formed, for example, by removing a portion of the second dielectric layer 114, or a portion of the second dielectric layer 114 and a portion of the first dielectric layer 112, to provide the multi-layered structure 81 including the patterned conductive layers 1110, 113 and 115 and the cavity 10. The cavity 10 may be formed using etching, laser drilling or any other suitable technique. In some embodiments, the cavity 10 is formed by laser drilling.

Figure 8E:
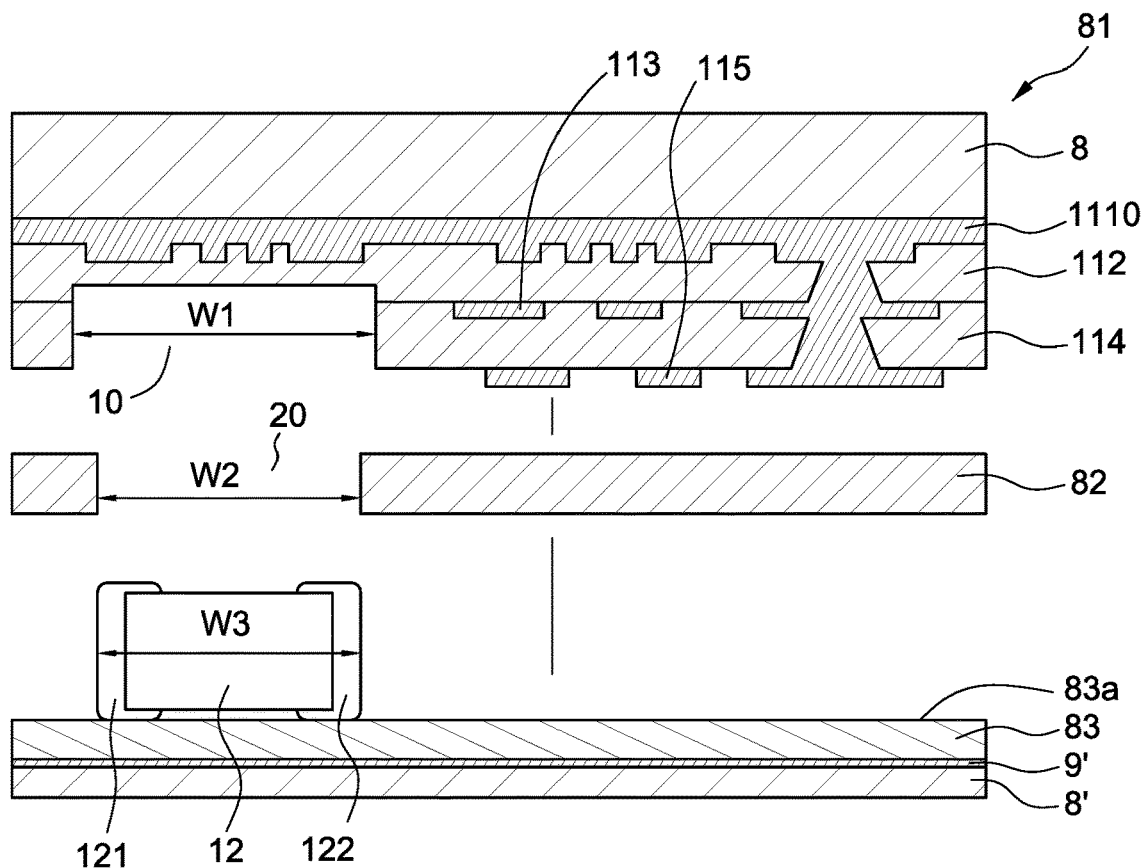

Referring to FIG. 8(e), a first dielectric structure 83 including a component 12 disposed on a first surface 83a of the first dielectric structure 83 is prepared by, for example, providing a second carrier 8' including a metal layer 9', forming the first dielectric structure 83 on the metal layer 9', and attaching the component 12 including two electrical contacts 121 and 122 to the first dielectric structure 83. The second carrier 8' and metal layer 9' may be described in a same manner as given above with respect to the first carrier 8 and metal layer 9. The first dielectric structure 83 is formed by attaching or coupling an adhesive layer to a surface of the metal layer 9'. The component 12 may be placed or pressed onto the first dielectric structure 83 by, for example, using chip shooter equipment. The component 12 may be attached or coupled to the dielectric structure 83 such that portions of the electrical contacts 121 and 122 are embedded in the first dielectric structure 83. The first dielectric structure 83 may affix the component 12 and provide sufficient electrical insulation.

The component 12 on the first dielectric structure 83 is aligned with the cavity 10 of the multi-layered structure 81 for lamination. In some embodiments, the lamination is carried out by providing, between the multi-layered structure 81 and the first dielectric structure 83, a second dielectric structure 82 (e.g., which includes glass fibers) defining an opening 20. The opening 20 of the second dielectric structure 82 is aligned with the cavity 10 of the multi-layered structure 81 and forms a space together with the cavity 10 of the multi-layered structure 81 to accommodate the component 12. In some embodiments, the second dielectric structure 82 is an integral structure not including glass fibers and defining no opening, and since the second dielectric structure 82 includes no glass fibers, an opening used for allowing the component 12 to pass through is not necessary.

A width W1 of the cavity 10 of the multi-layered structure 81 may be substantially identical to or greater than a width W3 of the component 12. A width W2 of the second dielectric structure 82 including glass fibers may be substantially identical to or greater than the width W3 of the component 12 such that the glass fibers may not damage the component 12 during lamination. The second dielectric structure 82 may be a B-stage resin, may possess suitable flowability and can fill into the remaining cavity 10 which is not occupied by the component 12 during lamination with heat. The second dielectric structure 82 can be cured by, for example, heating, in a subsequent step. The heated dielectric structure 82 becomes solidified or hardened and therefore affixes or holds the component 12.

Figure 8F:
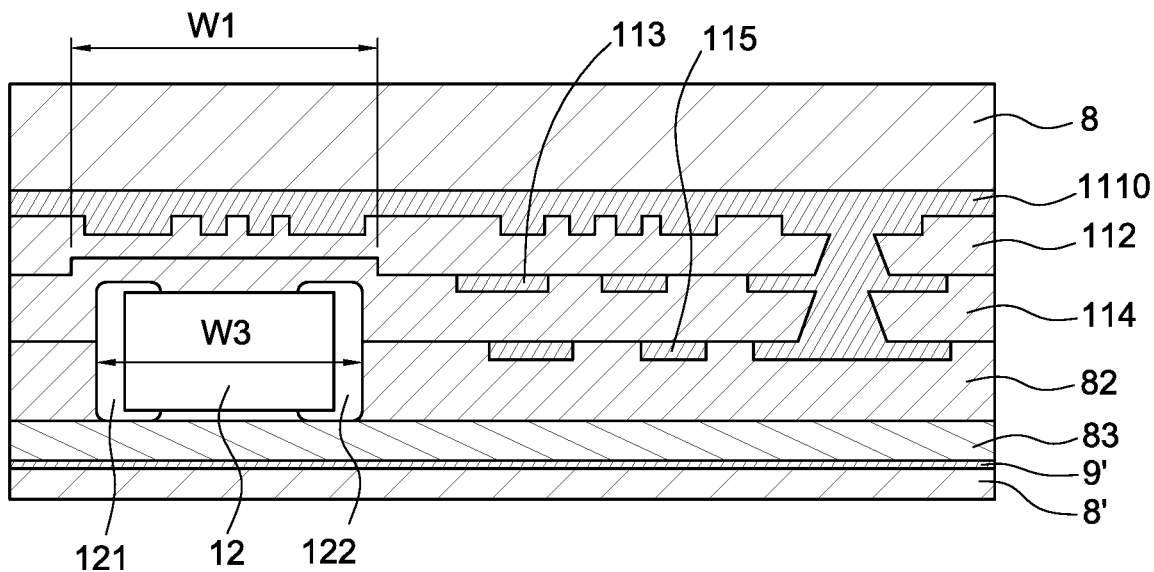

FIG. 8(f) illustrates a structure of the semiconductor substrate after lamination. As shown in FIG. 8(f), the width W1 of the cavity 10 of the multi-layered structure 81 is greater than the width W3 of the component 12, and a portion of the second dielectric structure 82 flows into and fills the cavity 10 and becomes a part of the second dielectric layer 114.

Figure 8G:
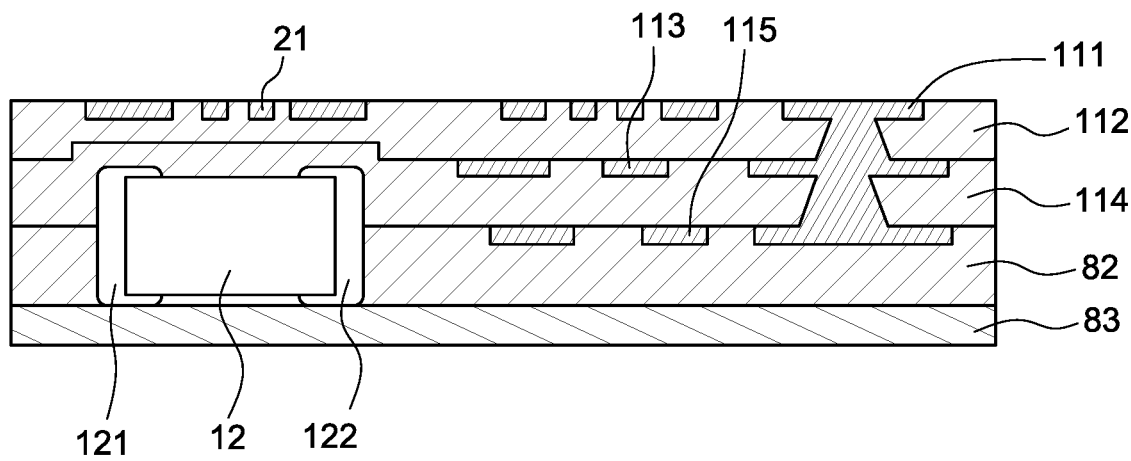

Referring to FIG. 8(g), the first carrier 8 and the second carrier 8' are removed. Then, an upper portion of the first patterned conductive layer 1110 is removed, for example, by etching, to prepare the first patterned conductive layer 111 with traces 21 embedded in the first dielectric layer 112. The metal layer 9' may be removed in a separate step or in a common step during the removal of the upper portion of the first patterned conductive layer 1110.

Figure 8H:
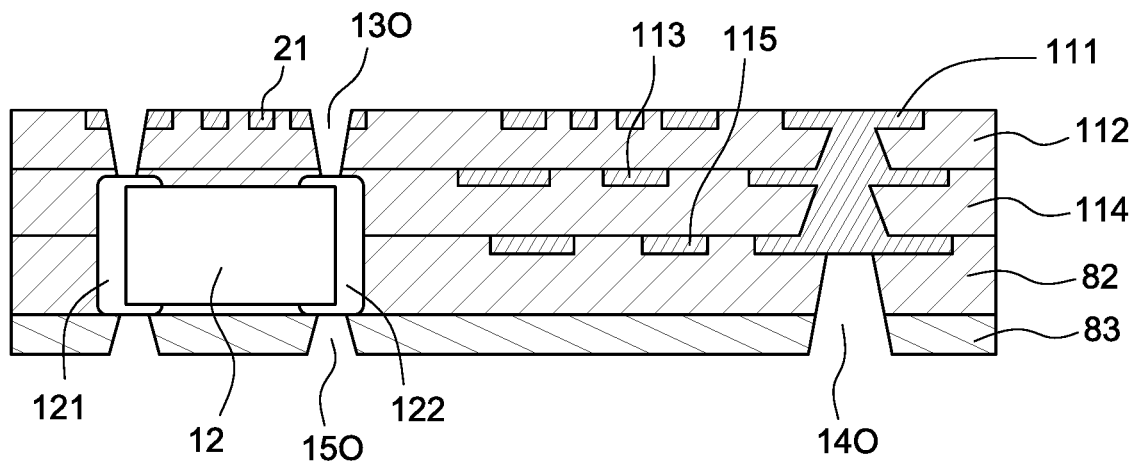

Referring to FIG. 8(h), a portion of the multi-layered structure 81 is removed to form a first via hole 13O exposing a portion of the upper surface of the electrical contact 121 or 122 of the component 12. A portion of the first dielectric structure 83 is removed to form a second via hole 15O exposing a portion of the lower surface of the electrical contact 121 or 122. Another portion of the first dielectric structure 83 and an adjacent portion of the second dielectric structure 82 are removed to form a third via hole 14O. The via holes 13O, 14O and 15O may be formed by using etching, laser drilling or any other suitable technique.

Figure 8I:
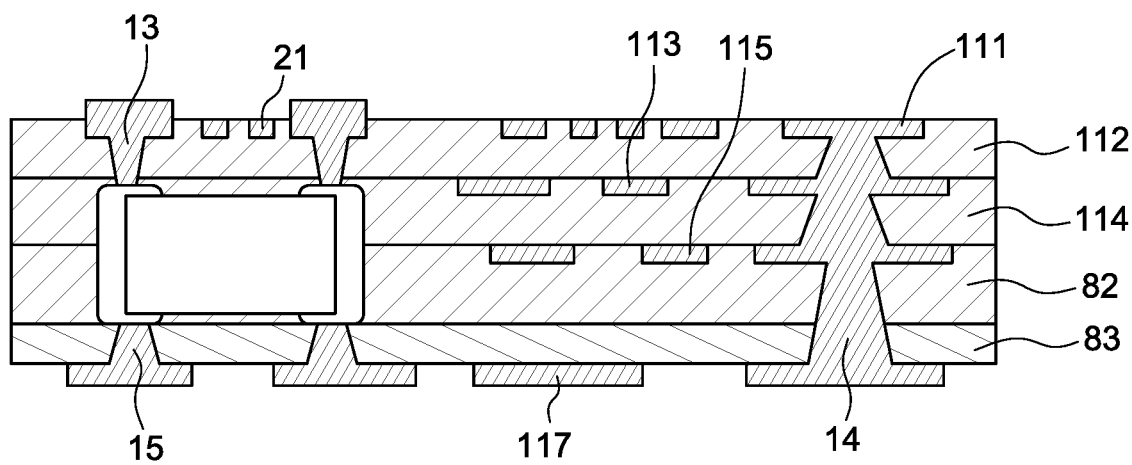

In FIG. 8(i), conductive vias 13, 14 and 15 are formed in the via holes 13O, 14O and 15O, respectively, and the fourth patterned conductive layer 117 is formed. The conductive vias 13, 14 and 15 and the fourth patterned conductive layer 117 may be formed by any suitable techniques as described herein. The conductive vias 13 and 15 may electrically connect the component 12 to one of the patterned conductive layers. For example (e.g., as shown in FIG. 8(h)), the conductive via 13 electrically connects the component 12 to the first patterned conductive layer 111.

Figure 8J:
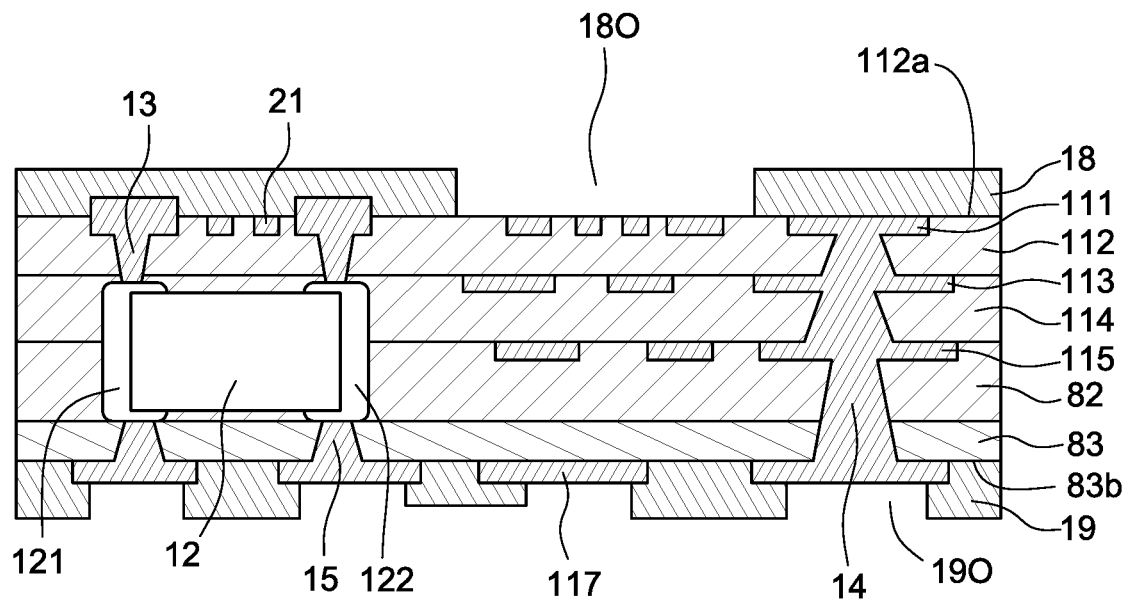

Referring to FIG. 8(j), a first solder resist layer 18 is formed on the upper surface 112a of the first dielectric layer 112 and a second solder resist layer 19 is formed on the lower surface 83b of first dielectric structure 83. The first solder resist layer 18 includes the plurality of openings 18O to expose portions of the first patterned conductive layer 111 for contacting another device, such as a flip-chip-mounted semiconductor die. The second solder resist layer 19 includes the plurality of openings 19O to expose portions of the fourth patterned conductive layer 117 for contacting another device, such as a printed circuit board.

FIG. 8(a), FIG. 8(b), FIGS. 8(k) and 8(l) illustrate a process for providing a multi-layered structure including a plurality of patterned conductive layers and a cavity according to some embodiments of the present disclosure.

The steps illustrated in FIGS. 8(a) and 8(b) are carried out to form a structure including the first carrier 8, the first patterned conductive layer 1110, the first dielectric layer 112, the conductive via 133, and the second patterned conductive layer 113.

Figure 8K:
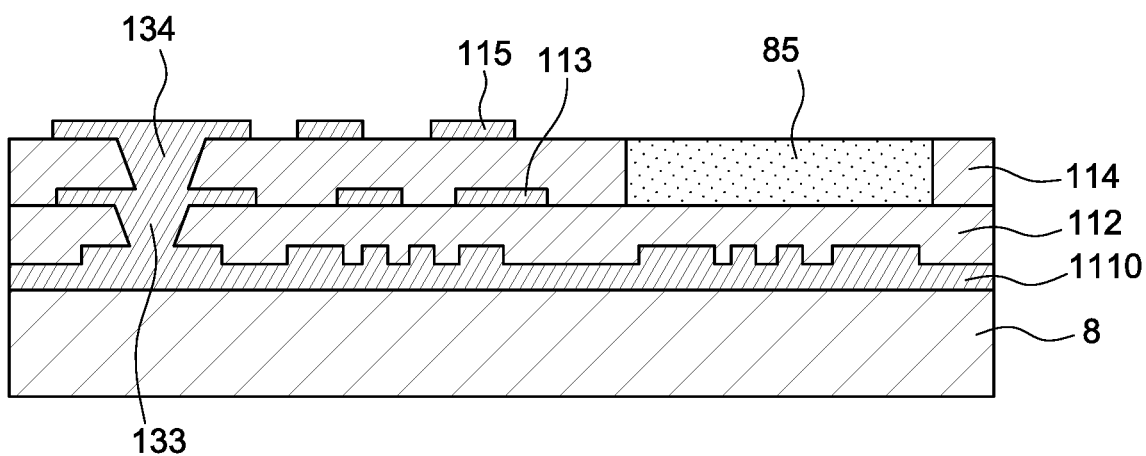
Figure 8I:
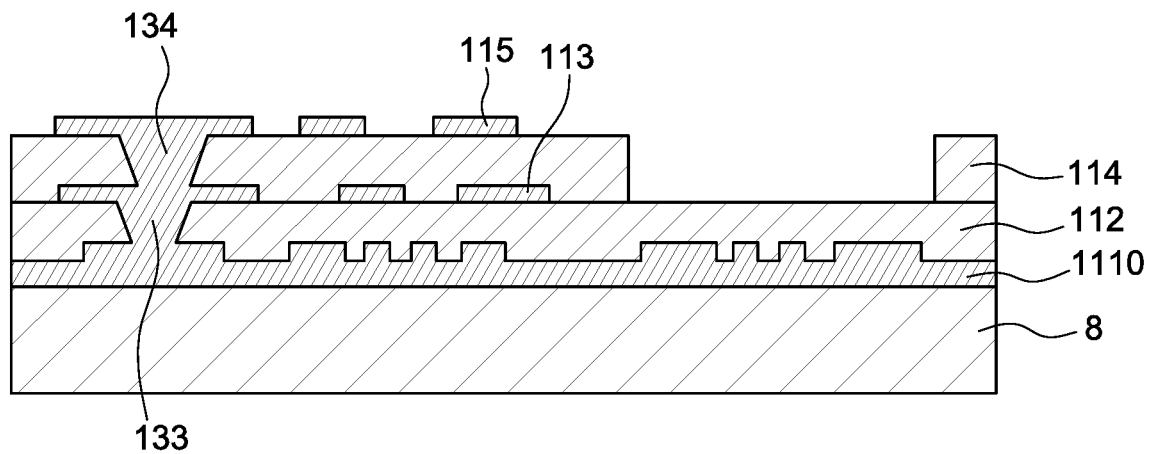

Referring to FIG. 8(k), a dry film 85 including a width substantially identical to or greater than the width W3 of the component 12 is applied to the second patterned conductive layer 113 to a position wherein a cavity is to be formed. A second dielectric layer 114 is formed on the second patterned conductive layer 113 and adjacent to the dry film 85 to embed or cover a remaining portion of the second patterned conductive layer 113. The conductive via 134 is formed on a second patterned conductive layer 113 and passes through the second dielectric layer 114. The third patterned conductive layer 115 is formed on the second dielectric layer 114 and is electrically connected to the conductive via 134 in a manner similar to those illustrated and described above with respect to FIG. 8(c).

Referring to FIG. 8(l), the dry film 85 is removed, for example, in a stripping process, and a cavity is formed.

Figure 9:
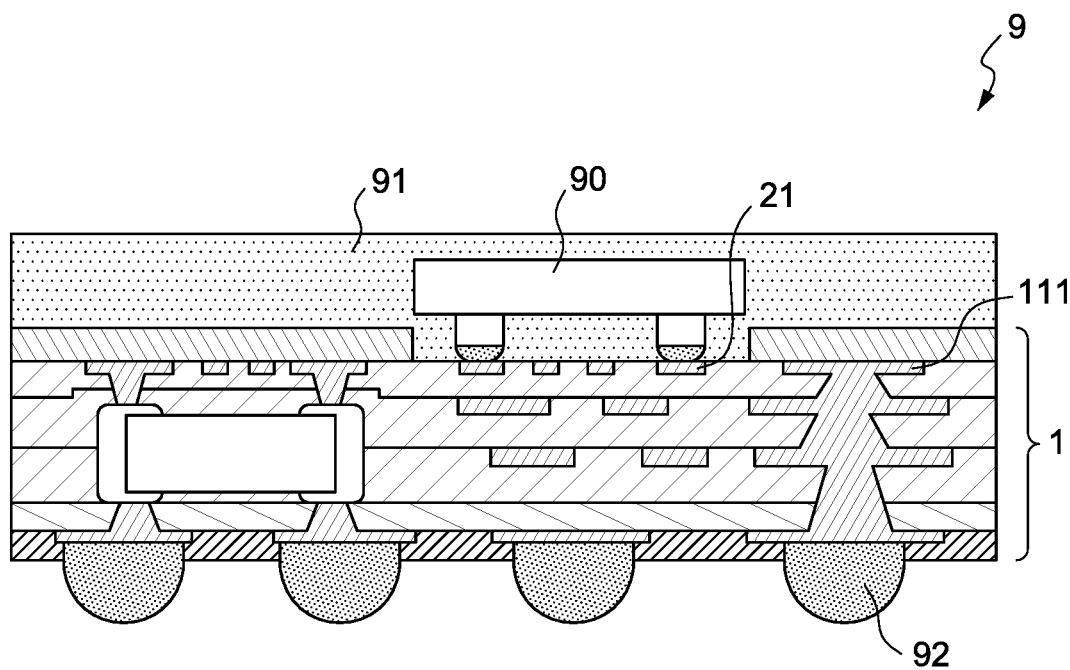
FIG. 9 illustrates a cross-sectional view of a semiconductor device package in accordance with some embodiments of the present disclosure.

FIG. 9 illustrates a cross-sectional view of a semiconductor device package 9 in accordance with some embodiments of the present disclosure. The semiconductor device package 9 includes the semiconductor substrate 1, a semiconductor die 90, an encapsulation layer 91 and solder balls 92. The semiconductor die 90 is disposed in the opening 18O defined by the first solder resist layer 18. In some embodiments, the semiconductor die 90 is flip-chip mounted onto a surface of the semiconductor substrate 1 exposed from the opening 18O and electrically connected to the traces 21 of the first patterned conductive layer 111. In some embodiments, solder balls 92 are applied to or inserted in the openings 19O defined by the second solder resist layer 19.

FIG. 10(a), FIG. 10(b), FIG. 10(c), FIG. 10(d), FIG. 10(e) and FIG. 10(f) illustrate a method for manufacturing the semiconductor substrate 7 in accordance with some embodiments of the present disclosure.

Figure 10A:
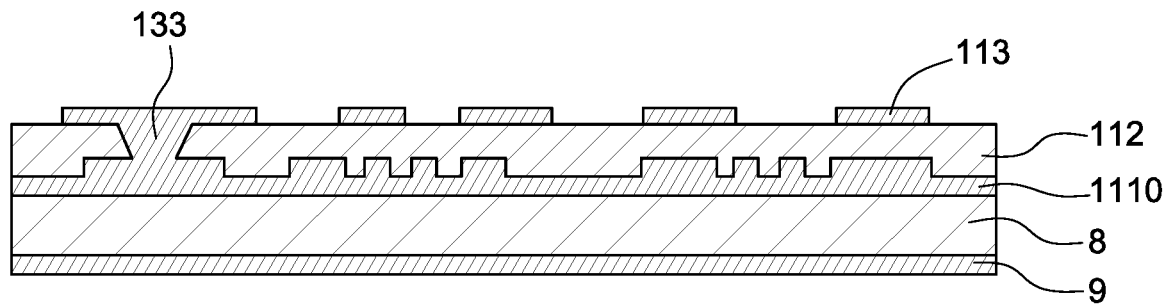
FIG. 10(a), FIG. 10(b), FIG. 10(c), FIG. 10(d), FIG. 10(e) and FIG. 10(f) illustrate a method for manufacturing a semiconductor substrate in accordance with some embodiments of the present disclosure.

Referring to FIG. 10(a), the first carrier 8 including the metal layer 9 on each of its two opposing surfaces is provided (e.g., as illustrated in FIG. 8(a)). The first patterned conductive layer 1110 is formed on the metal layer 9 and the first dielectric layer 112 is formed on the first patterned conductive layer 1110 to embed or cover the first patterned conductive layer 1110. The conductive via 133 is formed on the first patterned conductive layer 1110 and passes through the first dielectric layer 112. The second patterned conductive layer 113 is formed on the first dielectric layer 112. A formation of the first patterned conductive layer 1110, the first dielectric layer 112, the conductive via 133 and the second patterned conductive layer 113 is substantially similar as that illustrated and described with respect to FIG. 8(b).

Figure 10B:
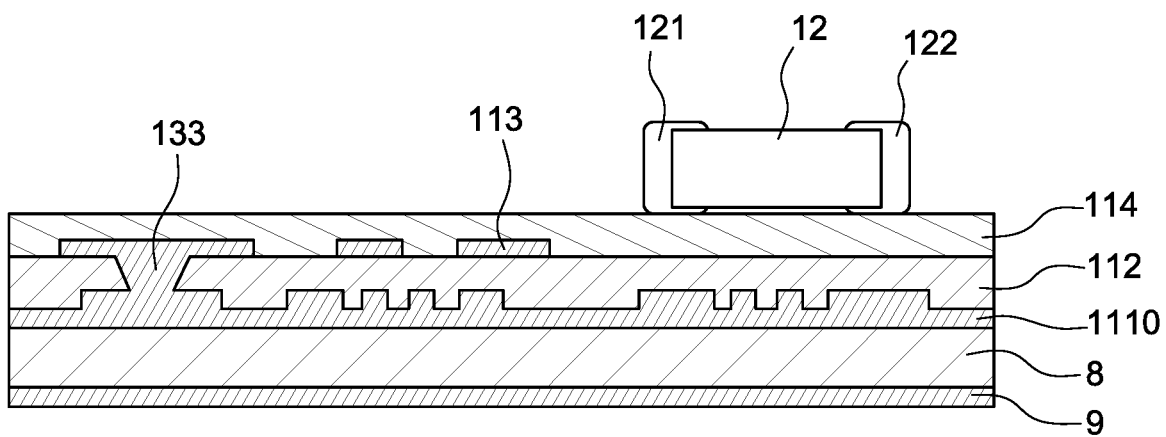

Referring to FIG. 10(b), the second dielectric layer 114 is formed on the second patterned conductive layer 113 to embed or cover the second patterned conductive layer 113. The second dielectric layer 114 may be formed by laminating a dielectric adhesive material (e.g., an adhesive including no glass fibers) to the first patterned conductive layer 1110.

The component 12 including two electrical contacts 121 and 122 is bonded to the second dielectric layer 114. The component 12 may be placed or pressed onto the second dielectric layer 114 by, for example, using chip shooter equipment. The second dielectric layer 114 can be cured by, for example, heating, in a subsequent step. The heated dielectric layer 114 becomes solidified or hardened and therefore affixes or holds the component 122.

Figure 10C:
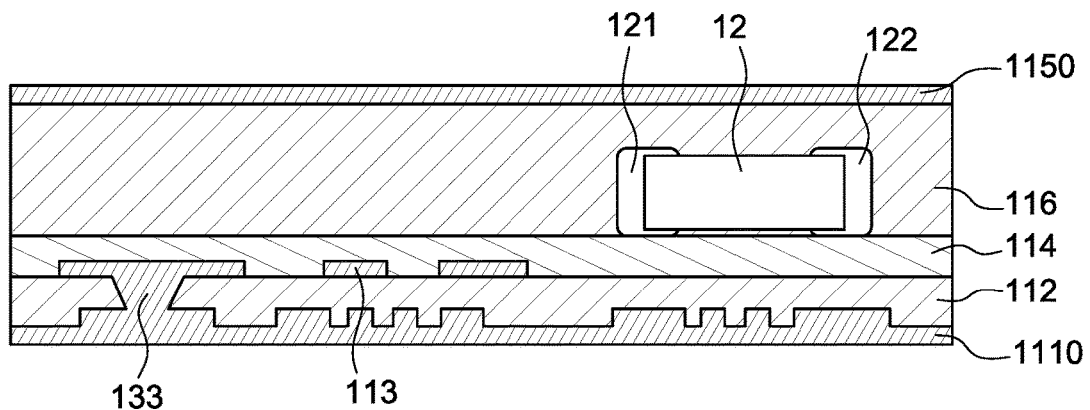

Referring to FIG. 10(c), the third dielectric layer 116 is formed on the second dielectric layer 114 to encapsulate the component 12. For example, the third dielectric layer 116 may be formed using a lamination technique which uses a dielectric layer to encapsulate the component 12. As another example, the third dielectric layer 116 may be formed by stacking or laminating a pre-impregnated composite material (e.g., PP) layer on the second dielectric layer 114 and the component 12 to form the third dielectric layer 116. A metal layer 1150 is formed on the third dielectric layer 116. In some embodiments, the metal layer 1150 may be preformed on the PP material layer.

Figure 10D:
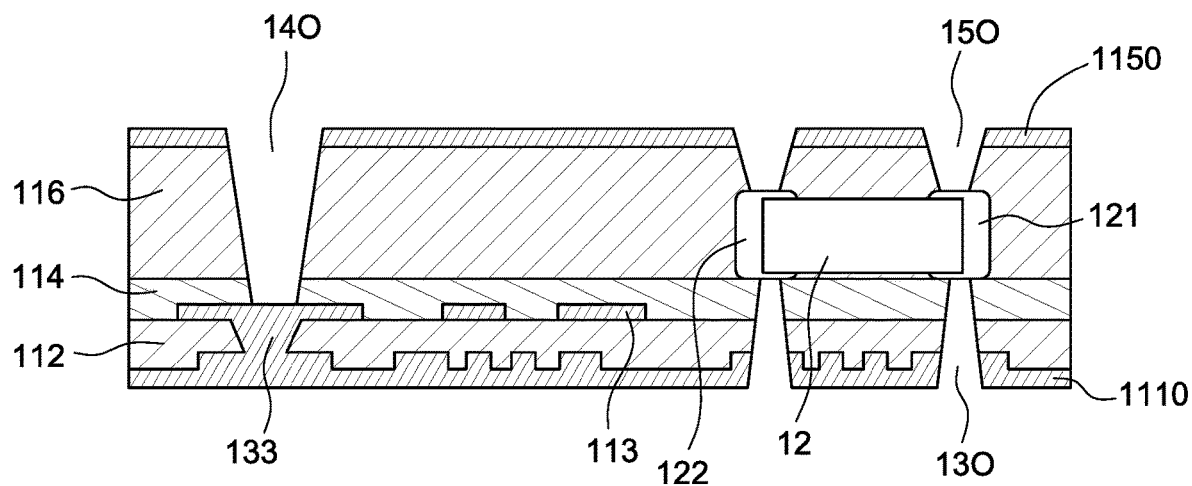

In FIG. 10(d), a portion of the metal layer 1150 and the third dielectric layer 116 is removed to form the first via hole 15O exposing a portion of the upper surface of the electrical contact 121 or 122 of the component 12. A portion of the first patterned conductive layer 1110, the first dielectric layer 112 and the second dielectric layer 114 are removed to form a second via hole 13O exposing a portion of the lower surface of the electrical contact 121 or 122. A portion of the metal layer 1150, the third dielectric layer 116 and the second dielectric layer 114 are removed to form the third via hole 14O. The via holes 13O, 14O and 15O may be formed by using etching, laser drilling or any other suitable technique.

Figure 10E:
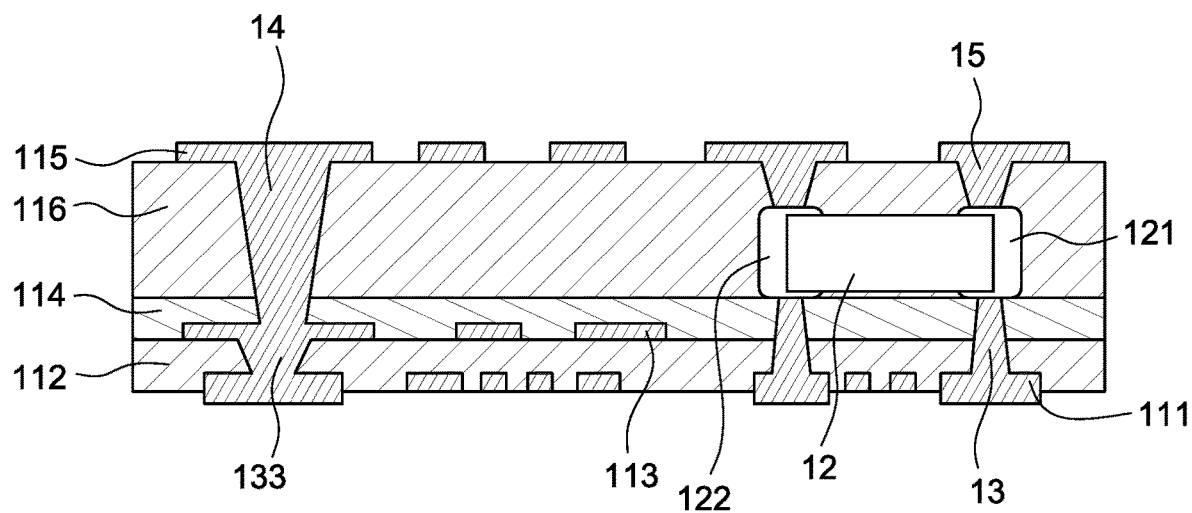

In FIG. 10(e), the conductive vias 13, 14 and 15 and are formed in the via holes 13O, 14O and 15O, respectively. The third patterned conductive layer 115 is formed by, for example, using photo-lithography and plating technology. After the formation of the conductive via 13, an etching process is carried out to remove a part of the first patterned conductive layer 1110 to from the first patterned conductive layer 111 such that the first patterned conductive layer 111 is embedded in the first dielectric layer 112.

Figure 10F:
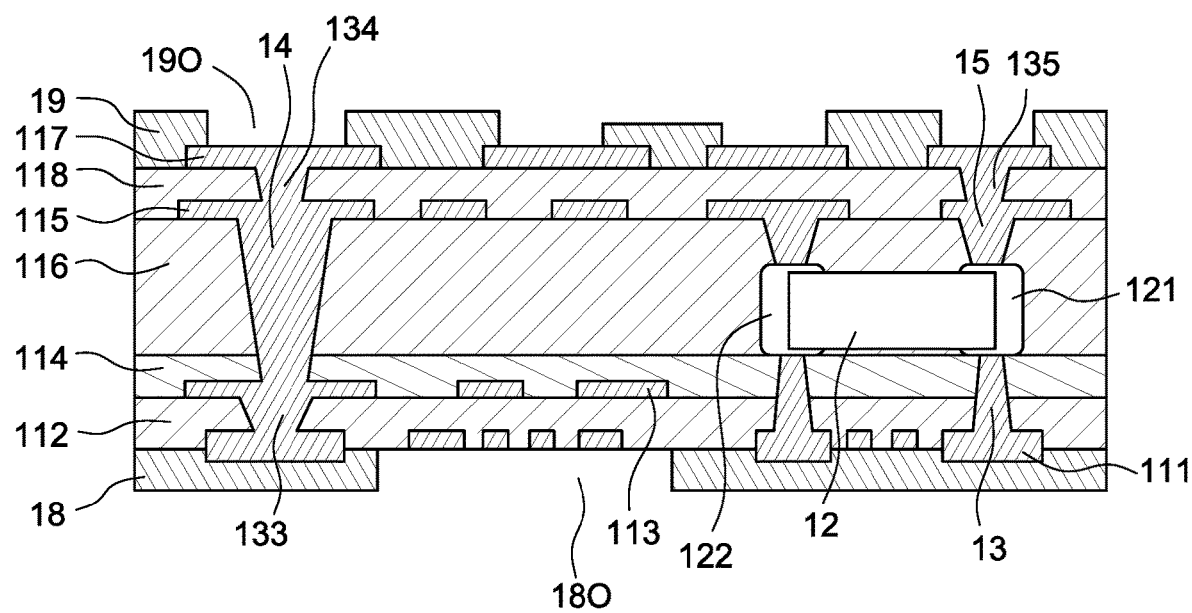

Referring to FIG. 10(f), the fourth dielectric layer 118 is formed on the third patterned conductive layer 115 to embed or cover the third patterned conductive layer 115. The conductive via 134 is formed on the third patterned conductive layer 115 and passes through the fourth dielectric layer 118. The fourth patterned conductive layer 117 is formed on the fourth dielectric layer 118. The formation of the fourth dielectric layer 118, conductive via 134 and fourth patterned conductive layer 117 is similar to the formation of the first dielectric layer 112, the conductive via 133 and the second patterned conductive layer 113 in connection with FIG. 8(b). The first solder resist layer 18 is formed on the first patterned conductive layer 111 and the first dielectric layer 112 and the second solder resist layer 19 is formed on the fourth dielectric layer 118. The first solder resist layer 18 includes the plurality of openings 18O to expose portions of the first patterned conductive layer 111 for contacting another device, such as a flip-chip-mounted semiconductor die. The second solder resist layer 19 includes the plurality of openings 19O to expose portions of the fourth patterned conductive layer 117 for contacting another device, such as a printed circuit board.

A multi-layered structure including a plurality of dielectric layers and a plurality of patterned conductive layers may be prepared using a comparable technique. However, to embed a component within the multi-layered structure, a cavity should be pre-formed in the multi-layered structure and a glue or other adhesive material should be applied to a bottom surface of the cavity to adhere the component within the cavity. In the manufacturing method according to some embodiments of the present disclosure, since the component is first attached to an adhesive layer which forms one of the dielectric layers of the semiconductor substrate, it is unnecessary to use glue or additional adhesive material for adhering the component and therefore, materials of the substrate are simplified and a risk of failure during the manufacturing method is reduced.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor substrate comprising:
   a multi-layered structure comprising a plurality of dielectric layers and a plurality of patterned conductive layers, wherein a topmost patterned conductive layer of the patterned conductive layers is embedded in a topmost dielectric layer of the dielectric layers;
   a component embedded in the multi-layered structure; and
   a first conductive via electrically connected to the component and one of the patterned conductive layers,
   wherein at least one of the patterned conductive layers is located at a depth spanning between a top surface of the component and a bottom surface of the component.

2. The semiconductor substrate of claim 1, wherein a portion of the topmost patterned conductive layer passes over the top surface of the component.

3. The semiconductor substrate of claim 1, wherein the first conductive via is electrically connected to the topmost patterned conductive layer and passes through at least two of the dielectric layers of the multi-layered structure.

4. The semiconductor substrate of claim 1, wherein the multi-layered structure comprises three dielectric layers and three patterned conductive layers.

5. The semiconductor substrate of claim 1, wherein the multi-layered structure comprises:
   a first dielectric layer comprising a first surface and an opposing second surface;
   a first patterned conductive layer embedded at the first surface of the first dielectric layer;
   a second dielectric layer comprising a first surface and an opposing second surface, wherein the first surface of the second dielectric layer is attached to the second surface of the first dielectric layer;
   a second patterned conductive layer embedded at the first surface of the second dielectric layer;
   a third dielectric layer comprising a first surface and an opposing second surface, wherein the first surface of the third dielectric layer is attached to the second surface of the second dielectric layer; and
   a third patterned conductive layer embedded at the first surface of the third dielectric layer,
   wherein the first dielectric layer is the topmost dielectric layer of the dielectric layers and the first patterned conductive layer is the topmost patterned conductive layer of the patterned conductive layers, and
   wherein the third patterned conductive layer is located at a depth spanning between the top surface and the bottom surface of the component.

6. The semiconductor substrate of claim 5, wherein the second surface of the first dielectric layer comprises a recess and the component is disposed under the recess.

7. The semiconductor substrate of claim 6, wherein the component passes through the second and third dielectric layers.

8. The semiconductor substrate of claim 5, wherein the bottom surface of the component is exposed from the second surface of the third dielectric layer of the multi-layered structure.

9. The semiconductor substrate of claim 8, further comprising:
   a fourth dielectric layer comprising a first surface and an opposing second surface, wherein the first surface of the fourth dielectric layer is attached to the second surface of the third dielectric layer of the multi-layered structure and directly contacts the bottom surface of the component; and
   a patterned conductive layer disposed on the second surface of the fourth dielectric layer.

10. The semiconductor substrate of claim 9, further comprising a second conductive via electrically connected to one of the patterned conductive layers of the multi-layered structure, wherein the second conductive via passes through at least two of the first, second, third and fourth dielectric layers.

11. The semiconductor substrate of claim 9, wherein the fourth dielectric layer and the third dielectric layer are made from different materials.

12. The semiconductor substrate of claim 11, wherein the third dielectric layer of the multi-layered structure is made from a dielectric material comprising glass fibers and wherein and the fourth dielectric layer is made from a dielectric material comprising no glass fibers.

13. The semiconductor substrate of claim 12, wherein the fourth dielectric layer is made from an adhesive resin and comprises a portion extending to a lateral surface of the component.

14. A semiconductor substrate comprising:
- a first dielectric structure comprising a first surface, a second surface opposing the first surface of the first dielectric structure, and a plurality of patterned conductive layers, wherein a topmost patterned conductive layer of the patterned conductive layers is embedded at the first surface of the first dielectric structure;
- a component embedded in the first dielectric structure and having a top surface and a bottom surface;
- a second dielectric structure attached to the second surface of the first dielectric structure and covering the bottom surface of the component; and
- a conductive via electrically connected to the component and to one of the patterned conductive layers,
- wherein at least one of the patterned conductive layers is located within a distance between the top surface of the component and the bottom surface of the component.

15. The semiconductor substrate of claim 14, wherein the first dielectric structure and the second dielectric structure are made of different materials.

16. The semiconductor substrate of claim 14, where the second dielectric structure is made of an adhesive resin and comprises a portion extending to a lateral surface of the component.

17. A semiconductor substrate comprising:
- a multi-layered structure comprising a plurality of dielectric layers and a plurality of patterned conductive layers, wherein a topmost patterned conductive layer of the patterned conductive layers is embedded in a topmost dielectric layer of the dielectric layers; and
- a component embedded in the multi-layered structure and having a top surface and a bottom surface,
- wherein the top surface of the component is at a first height, the bottom surface of the component is at a second height, and at least one of the patterned conductive layers is at a third height between the first height and the second height.

18. The semiconductor substrate of claim 17, wherein the topmost patterned conductive layer is higher than the top surface of the component.

19. The semiconductor substrate of claim 17, wherein a portion of the topmost patterned conductive layer is disposed over the top surface of the component.

20. The semiconductor substrate of claim 17, further comprising:
- an additional dielectric layer attached to a bottommost dielectric layer of the dielectric layers; and
- a conductive via penetrating the additional dielectric layer and connected to the component.

* * * * *